United States Patent
Teunissen et al.

(10) Patent No.: US 6,987,555 B2
(45) Date of Patent: Jan. 17, 2006

(54) LITHOGRAPHIC APPARATUS, DEVICE MANUFACTURING METHOD, AND DEVICE MANUFACTURED THEREBY

(75) Inventors: Paulus Antonius Andreas Teunissen, Eindhoven (NL); Gerrit Johannes Nijmeijer, Eindhoven (NL); Rene Marinus Gerardus Johan Queens, Eindhoven (NL); Frank Staals, Eindhoven (NL); Robert Jan Van Wijk, Valkenswaard (NL); Roeland Nicolaas Maria Vanneer, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/892,395

(22) Filed: Jul. 16, 2004

(65) Prior Publication Data

US 2005/0030507 A1 Feb. 10, 2005

Related U.S. Application Data

(63) Continuation-in-part of application No. 10/419,979, filed on Apr. 18, 2004, now Pat. No. 6,906,785.

(30) Foreign Application Priority Data

Apr. 23, 2002 (EP) .................................. 02252852

(51) Int. Cl.
G03B 27/42 (2006.01)
G03B 27/52 (2006.01)
G03B 27/32 (2006.01)
G01N 21/86 (2006.01)

(52) U.S. Cl. ........................ 355/53; 355/55; 355/77; 250/548

(58) Field of Classification Search ................. 355/53, 355/67, 77; 250/548; 356/399, 500, 400, 356/401; 703/2
See application file for complete search history.

(56) References Cited

U.S. PATENT DOCUMENTS

| 5,191,200 | A | * | 3/1993 | van der Werf et al. | .. 250/201.4 |
| 5,204,535 | A | * | 4/1993 | Mizutani | ..................... 250/548 |
| 5,461,237 | A | | 10/1995 | Wakamoto et al. | |
| 5,657,130 | A | * | 8/1997 | Shirasu et al. | .............. 356/401 |
| 5,838,595 | A | | 11/1998 | Sullivan et al. | |
| 5,960,107 | A | | 9/1999 | Leroux | |

\* cited by examiner

*Primary Examiner*—Alan Matthews
(74) *Attorney, Agent, or Firm*—Pillsbury Winthrop Shaw Pittman LLP (57) ABSTRACT

According to one embodiment, a method of calibrating level sensors of at least two lithographic projection apparatus to correct machine to machine level sensor process dependency includes using a first lithographic projection apparatus to measure a first set of leveling data for a reference substrate and a second set of leveling data for a substrate processed according to a selected process, and using a second lithographic projection apparatus to measure a third set of leveling data for the reference substrate and a fourth set of leveling data for the processed substrate. The method also includes calculating, based on the first, second, third and fourth sets of leveling data, a set of level sensor parameters corresponding to machine to machine level sensor differences for the selected process, wherein the machine to machine level sensor differences are measured and stored as intrafield values.

29 Claims, 3 Drawing Sheets

LITHOGRAPHIC APPARATUS, DEVICE MANUFACTURING METHOD, AND DEVICE MANUFACTURED THEREBY

RELATED APPLICATIONS

This application is a Continuation-In-Part of U.S. patent application Ser. No. 10/419,979, filed on Apr. 18, 2004 now U.S. Pat. No. 6,906,785, entitled "Lithographic Apparatus, Device Manufacturing Method and Device Manufactured Thereby", which in turn claims priority to European Patent Application No. EP02252852.5, filed on Apr. 23, 2002. The contents of these applications are incorporated herein in their entirety by reference.

FIELD OF THE INVENTION

The present invention relates to lithographic apparatus and methods.

BACKGROUND

The term "patterning structure" as here employed should be broadly interpreted as referring to a structure that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-adressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-adressable mirrors. The required matrix addressing can be performed using suitable electronic means. In both of the situations described hereabove, the patterning structure can include one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, which is incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer.

Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. Nos. 5,969,441 and WO 98/40791, incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

For the correct positioning of substrate tables in the focus plane of the projection lens, a level sensor may be used. Level sensors used in lithographic projection apparatus may be subject to at least two types of process dependency. Process dependency is a type of error in which level sensor measurements provide differing results depending on how the substrate being measured has been processed. For example, a substrate having a resist coating may appear to the level sensor to be tilted when it is, in fact, perfectly flat (i.e., has no tilt). Likewise, even in the case that the surface of the resist is at exactly the same height as a surface of a bare substrate, the level sensor may measure the two substrates to have different heights. The first type of error is known as tilt process dependency and the second type of error is known as height process dependency.

Moreover, even apparently identical wafer processing machines may exhibit different tilt process dependency and/or height process dependency for a given process. That is, for a particular substrate that has been processed according to a particular process, the measured height and/or tilt process dependency may vary from machine to machine. This is likewise true for machines of different types. In a fabrication facility, it is common to have many machines working on executing a particular process. An available method of measuring and correcting such machine to machine dependencies is to perform a FEM (focus energy matrix) for every machine for each process. FEMs (and their readout on external devices) are time consuming and performing one for each machine for each process results in undesirable amounts of machine downtime. Thus, the inventors have observed that it would be helpful to characterize differences in process dependencies from machine to machine without having to measure a complete focus energy matrix for every machine for every process.

SUMMARY

One embodiment of the invention provides a lithographic apparatus including a radiation system configured to provide a beam of radiation; a support structure configured to support a patterning structure, the patterning structure being configured to pattern the beam according to a desired pattern; a substrate table configured to hold a substrate; a projection system configured to project the patterned beam onto a target portion of the substrate; a measuring unit configured to measure a first set of leveling data using a first lithographic projection apparatus for a reference substrate; a measuring unit configured to measure a second set of leveling data using the first apparatus for a processed substrate processed according to a selected process; a measuring unit configured to measure a third set of leveling data using the second apparatus for the reference substrate; a measuring unit configured to measure a fourth set of leveling data using the second apparatus for the processed substrate; and a processor configured to use the first, second, third and fourth sets of leveling data to calculate a set of level sensor parameters corresponding to machine to machine level sensor differences for the selected process, wherein the machine to machine level sensor differences are measured and stored as intrafield values.

In another embodiment, a method of calibrating level sensors of at least two lithographic projection apparatus to correct machine to machine level sensor process dependency includes, using a first lithographic apparatus, measuring a first set of leveling data for a reference substrate and measuring a second set of leveling data for a substrate processed according to a first process; using a second lithographic apparatus, measuring a third set of leveling data for a reference substrate and measuring a fourth set of leveling data for a substrate processed according to the first process; and based on the first, second, third and fourth sets of leveling data, calculating a set of level sensor parameters corresponding to machine to machine level sensor differences for the first process, wherein the machine to machine level sensor differences are measured and stored as intrafield values.

In another embodiment of the invention, a lithographic system includes a radiation system configured to provide a beam of radiation; a support structure configured to support a patterning structure, the patterning structure being configured to pattern the beam according to a desired pattern; a substrate table configured to hold a substrate; a projection system configured to project the patterned beam onto a target portion of the substrate; in a first lithographic apparatus, means for measuring a first set of leveling data for a reference substrate; in the first lithographic apparatus, means for measuring a second set of leveling data for a substrate processed according to a first process; in a second lithographic projection apparatus, means for measuring a third set of leveling data for a reference substrate; in the second lithographic projection apparatus, means for measuring a fourth set of leveling data for a substrate processed according to the first process; and a processor configured to calculate, based on the first, second, third and fourth sets of leveling data, a set of level sensor parameters corresponding to machine to machine level sensor differences for the first process, wherein the machine to machine level sensor differences are measured and stored as intrafield values.

According to another embodiment, a device manufacturing method using a lithographic apparatus comprises imaging a patterned beam of radiation onto a target area of a substrate having a layer of radiation sensitive material and, prior to said imaging, determining and providing a set of process dependent parameters for adjusting the imaging. The determining includes, using a first lithographic apparatus, measuring a first set of leveling data for a reference substrate and measuring a second set of leveling data for a substrate processed according to a first process; using a second lithographic apparatus, measuring a third set of leveling data for the reference substrate and measuring a fourth set of leveling data for a substrate processed according to the first process; and, based on the first, second, third and fourth sets of leveling data, calculating a set of level sensor parameters corresponding to machine to machine level sensor differences for the first process, wherein the machine to machine level sensor differences are measured and stored as intrafield values.

A method of calibration according to a further embodiment comprises, using a first sensor of a first lithographic apparatus, measuring a first set of surface position data for a reference substrate and measuring a second set of surface position data for a substrate processed according to a first process. The method includes, using a second sensor of a second lithographic apparatus, measuring a third set of surface position data for a reference substrate and measuring a fourth set of surface position data for a substrate processed according to the first process. Based on the first, second, third and fourth sets of surface position data, a plurality of distances between a measurement error of the first sensor corresponding to the first process and a measurement error of the second sensor corresponding to the first process, is calculated wherein each of said plurality of distances is associated with a corresponding location, all of the corresponding locations being within the same exposure field of the second lithographic apparatus.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiments of the present invention include apparatuses and methods of matching performance from machine to machine, such as methods for calibrating level sensors of at least two lithographic projection apparatus.

Figure 1:
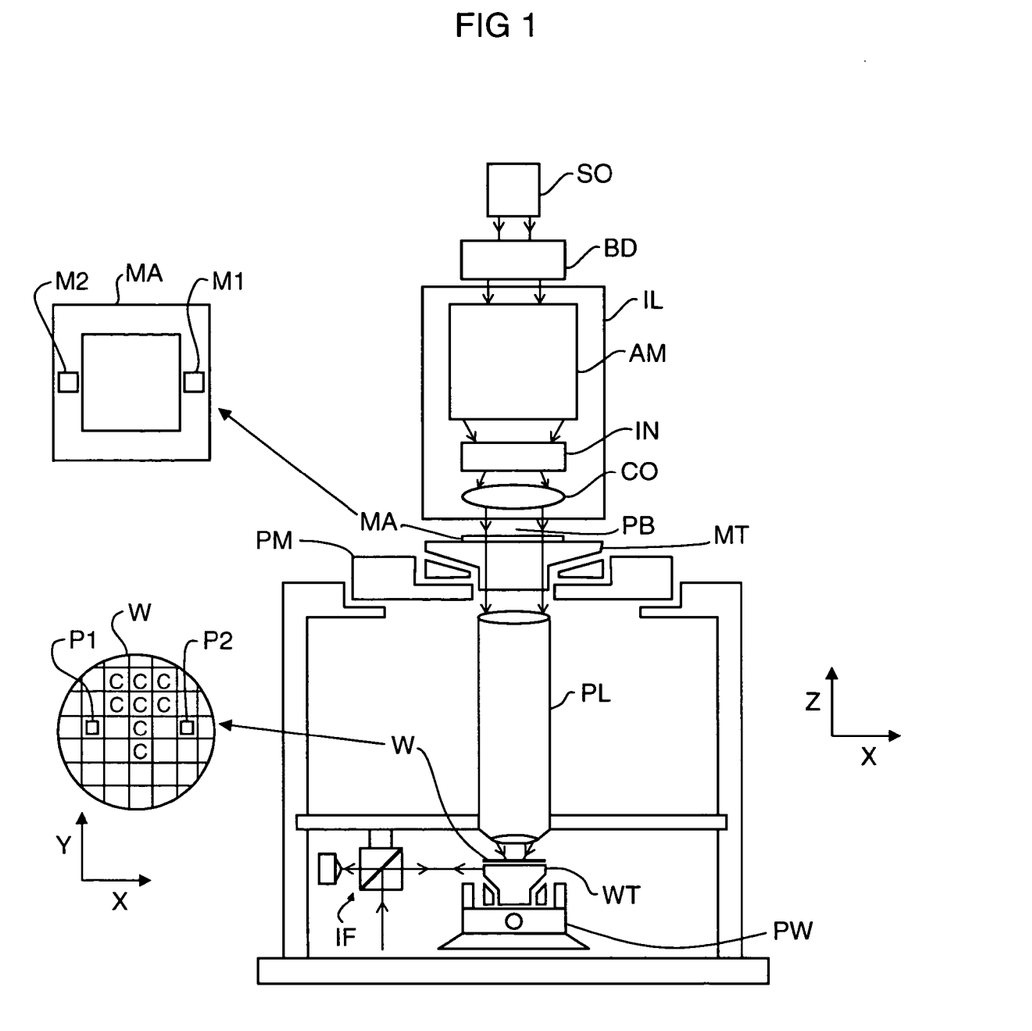
FIG. 1 depicts a lithographic projection apparatus according to an embodiment of the invention.

FIG. 1 schematically depicts a lithographic projection apparatus 1 according to an embodiment of the invention. The apparatus includes a radiation system Ex, IL, configured to supply a beam PB of radiation (e.g. EUV, DUV, electron beam or x-ray radiation). In this embodiment of the invention, the radiation system also includes a radiation source LA. The apparatus also includes a first object table (mask table) MT provided with a mask holder configured to hold a mask MA (e.g. a reticle), and connected to a first positioning device configured to accurately position the mask with respect to the projection system ("lens"), item PL. The apparatus further includes a second object table (substrate table) WT provided with a substrate holder configured to hold a substrate W (e.g. a resist-coated silicon wafer), and connected to second positioning device configured to accurately position the substrate with respect to the projection system ("lens"), item PL, the projection system ("lens") PL (e.g. catadioptric, refractive, reflective and/or diffractive elements) being configured to image an irradiated portion of the mask MA onto a target portion C (e.g. including one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source SO (e.g. a laser, lamp, x-ray, ion or electron source) produces a beam of radiation. This beam is fed into an illumination system (illuminator) IL, either directly or after having traversed a conditioning structure, such as a beam expander, for example. The illuminator IL may include an adjusting structure AM configured to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source SO may be within the housing of the lithographic projection apparatus (as is often the case when the source SO is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device (and an interferometric measuring device IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. During imaging, the reticle and substrate may be aligned using reticle alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once (i.e. in a single "flash") onto a target portion C (corresponding to an exposure field). The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V =Mv, in which M is the magnification of the lens PL (typically, M=¼ or ⅕). In this manner, a relatively large target portion C (corresponding to an exposure field) can be exposed, without having to compromise on resolution. Combinations and/or variations on the above described modes of use or entirely different modes of use may also be employed.

An important factor influencing the imaging quality of a lithographic apparatus is the accuracy with which the mask image is focused on the substrate. In practice, since the scope for adjusting the position of the focal plane of the projection system PL is limited and the depth of focus of that system is small, it is desirable to position the exposure area of the wafer (substrate) very accurately in the focal plane of the projection system PL. To do this, it is desirable to know both the position of the focal plane of the projection system PL and the position of the top surface of the wafer. Wafers are polished to a very high degree of flatness but nevertheless deviation of the wafer surface from perfect flatness (referred to as "unflatness") of sufficient magnitude noticeably to affect focus accuracy can occur. Unflatness may be caused, for example, by variations in wafer thickness, distortion of the shape of the wafer or contaminants on the wafer holder. The presence of structures due to previous process steps also significantly affects the wafer height (flatness). In at least some applications of the present invention, the cause of unflatness may be largely irrelevant. Unless the context otherwise requires, references below to "the wafer surface" refer to the top surface of the wafer onto which will be projected the mask image.

In an embodiment of the invention, the level sensor measures the vertical position of the wafer surface, $Z_{LS}$, at a plurality of points (e.g. with respect to the vertical (Z) position of a physical reference surface), and a second sensor, for example an interferometer (referred to hereafter as the Z-interferometer) or a linear variable differential transformer, simultaneously measures the vertical position of the substrate table, $Z_{IF}$ at the same points. Any other suitable sensor may be used as the second sensor. The wafer surface height is determined as $Z_{Wafer}=Z_{LS}-Z_{IF}$. The substrate table carrying the wafer is then transferred to the exposure station, and the vertical position of the physical reference surface is again determined. The height map may then be referred to in positioning the wafer at the correct vertical position during the exposure process. One example of a level sensor that could be used in accordance with the present invention is disclosed in U.S. Pat. No. 5,191,200, and U.S. patent application Ser. No. 09/519,875 filed Mar. 6, 2000 both of which are herein incorporated by reference in their entirety.

Figure 2:
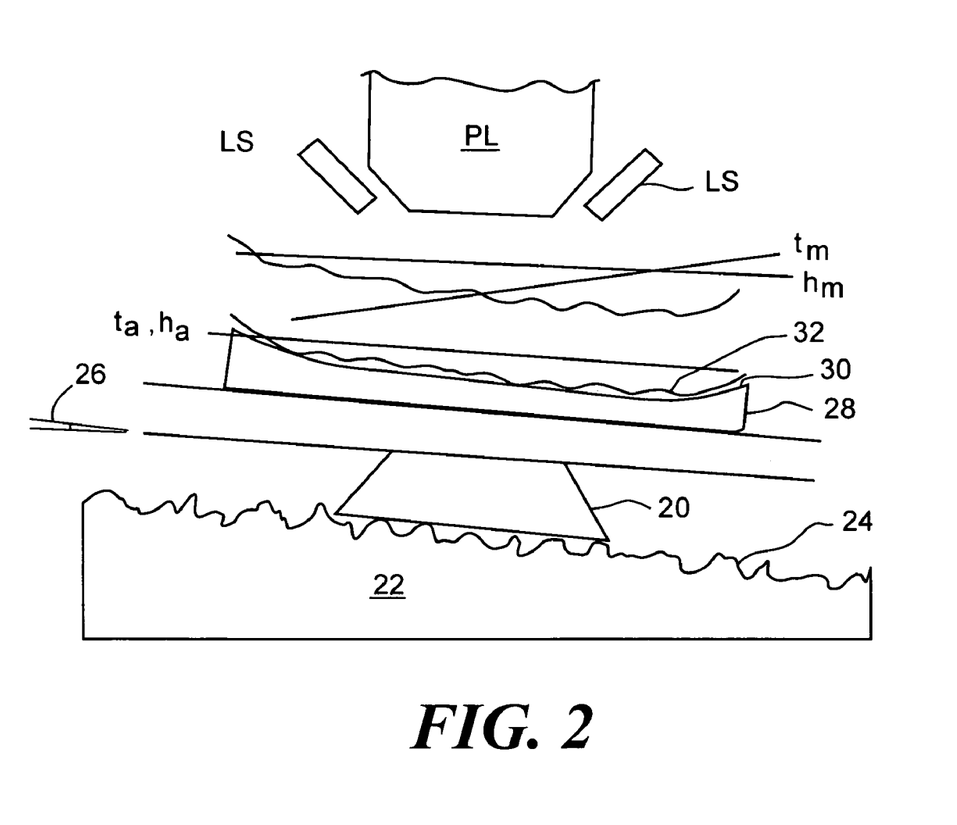
FIG. 2 is a schematic diagram showing various contributions to level sensor errors.

As shown in FIG. 2, there are many contributions to measurement errors in level sensor measurements. In an illustrative example, an airfoot 20 rests on a base 22. The base itself may have an inherent tilt. Further, base unflatness 24 (topography) can result in additional local tilt depending on how the airfoot 20 rests on the base 22. The airfoot is coupled to a chuck 28 via a set of chuck actuators (not shown). The chuck actuators may themselves have some tilt 26, which may be further increased if some of the actuators are actuated improperly. The chuck 28 itself may not be perfectly flat both in topography 30 and in tilt. If the chuck 28 is not perfectly flat, this can translate to unflatness of the wafer 32. Moreover, the wafer 32 itself may not be flat, it may have a wedge shape or other topology. As a result of all of these contributions, the level sensor may measure the surface of the wafer to be at a height $h_M$ different from its actual height $h_a$. Furthermore, it may measure a tilt $t_m$ different from the actual tilt $t_a$. Such errors in height and tilt measurement can result in the plane of focus of the imaging radiation to be located in the wrong plane, reducing resolution of the imaging apparatus. Moreover, as may be seen from FIG. 2, if a measured tilt is opposite to the actual tilt of the substrate, any tilt correction applied to the chuck will actually aggravate the situation rather than correct it.

Figure 3A:
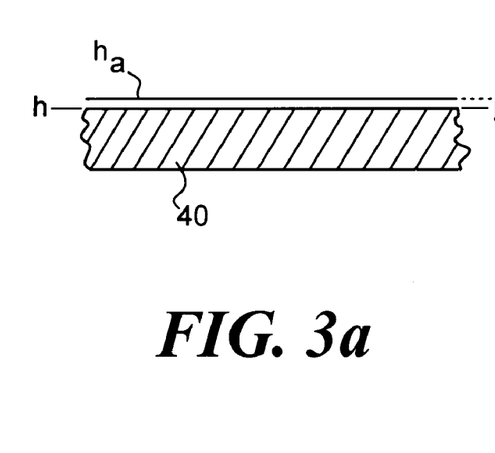
FIGS. 3a–c schematically illustrate process dependency.
Figure 3B:
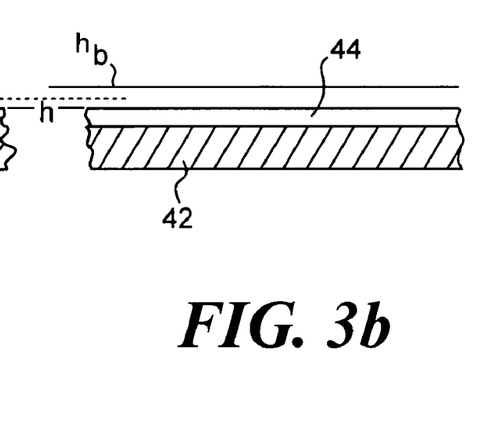
Figure 3C:
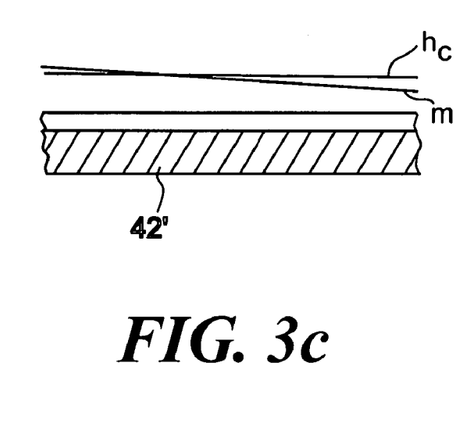

FIGS. 3a-c schematically show an example of the two types of process dependency. A first, bare substrate 40 is located at a physical height h while a processed substrate 42, in this case a substrate coated with a layer of photoresist 44, is located at the same physical height h. A theoretical ideal height measuring system should determine that the surface of the bare substrate is at the exact same height as the surface of the resist of the processed substrate. However, in reality, it has been observed that the measured height $h_a$ of the bare substrate 40 will often be different from the measured height $h_b$ of the processed substrate 42 (note that $h_a$ is shown slightly different from h to represent measurement error other than process dependency). Moreover, it is possible that the measurement m of the processed substrate 42' will further show some degree of tilt as illustrated in FIG. 3c and result in an average height $h_c$, which is yet again different from the physical height h.

In FIGS. 3a–c, the coordinates are shown such that the flat substrate lies in an XY plane and the Z direction extends perpendicular to the XY plane. In an embodiment of the invention, using this system of coordinates, the process dependency may be characterized using three parameters, displacement in the Z direction, rotation about the Y axis and rotation about the X axis. According to another embodiment of the invention, these three parameters can be measured at a plurality of points on the substrate's surface in order to produce a set of parameters that characterize the substrate as a whole. The number of points measured can be selected to provide a desired resolution and may correspond, for example, to a number of shot areas on the substrate.

In an example of a method in accordance with an embodiment of the present invention, a particular process is characterized for a pair of machines. For each machine ($M_A$ and $M_B$) a height measurement $z_1$, for a reference substrate, and a second height measurement $Z_2$ for a substrate processed in accordance with the process to be characterized is made. The term 'reference substrate' is intended to mean a substrate for which each machine has been set up such that, based upon measurement by the level sensor, the substrate is positioned precisely in the focal plane of the projection system PL. The measurements can be made for a series of points (x,y) on the surface of the substrates and a set of Δz(x,y) can be calculated by simply subtracting $z_1$ from $z_2$ for each point (x,y). This set corresponds to a map of height process dependencies (including wafer thickness differences, for non-ideal wafers) for that machine. Similarly, a set of $R_x$ and $R_y$ measurements can be made for each machine. Though data sets are described herein, it may also be sufficient to perform a measurement at a single point x,y rather than a series of such points. Such a single point should be considered to be a set having only one member.

In an embodiment of the invention, the reference substrate may be a bare substrate (or a substrate having a coating which gives no process dependency, e.g. a calibration coating). In another embodiment of the invention, the reference substrate may be a substrate that has been processed in some predetermined way that has been characterized using another method, such as a FEM, for example. For such a processed reference substrate, once the process dependency for that substrate is known, it may be used just as another type of reference substrate would be used.

In an embodiment of the invention, the height measurement performed with the reference substrate for machine $M_A$ includes imaging a grating from a mask onto the reference substrate. The imaging may be repeated a number of times, e.g. each time at a different location on the substrate and with the substrate at a different vertical height. The gratings exposed in the substrate are analyzed to determine which vertical height gave the sharpest image of the grating (i.e. the optimum focal plane for the reference substrate). Typically the analysis is done by inspecting latent images formed on the substrate. This vertical height is recorded as the optimum focal plane for the reference substrate (the height is monitored and recorded using the Z-interferometer). The level sensor is then used to measure the vertical height of the substrate that has been found to be the optimum focal plane. The measured height is recorded as the optimum setting of the Z-interferometer and of the level sensor for the reference substrate. The measured height is typically not equated with zero, because the reference substrate itself has a finite thickness. If the thickness of the reference substrate is known, then this can be used to determine the correct zero height for the Z-interferometer and the level sensor.

The measurements are also performed for machine $M_B$. The measurements may be time consuming, but may be extremely accurate. It may be desirable to do these measurements when a machine is initially installed.

The next step in the method is to measure for machine $M_A$ the optimum focal plane for a processed substrate. The term 'processed substrate' is intended to mean a substrate that already has had one or more layers (e.g. having patterns, such as circuit patterns) imaged and fixed onto it, for example via developing and etching of the substrate. The method described above for measuring the optimum focal plane may be used, but since such a method may be time consuming, a simpler method may be used. In one example a pattern is exposed on the substrate, the pattern being a particular type which only properly forms a full image if it is located in the focal plane of the substrate. The pattern may for example comprise an array of four phase gratings, two of which have their grating lines aligned in a first direction and the other two having their grating lines perpendicular to the first direction. The lines of the grating are a chopped structure with a sub-resolution chop linewidth. For example, if the overall grating period is 16 μm, the chop linewidth may be in the range of 0.7 to 0.25 μm. A pattern of this type is conventionally referred to as a focus energy matrix (FEM). More details of the FEM can be found in Focus and Exposure Dose Determination using Stepper Alignment by Peter Dirksen et al, SPIE Vol. 2726/799 (1996), which is incorporated herein by reference.

The FEM is imaged onto the substrate at different locations, each time with the substrate at a different vertical height. The height measurements of the level sensor and of the Z-interferometer are recorded for each vertical height. The substrate is processed, and the pattern analyzed (for example using an off-line metrology tool) to determine which vertical height gave the best image, i.e. which vertical height corresponds to the optimum focal plane for the processed substrate. The height measurements of the Z-interferometer and of the level sensor which corresponded to the optimum vertical height of the substrate are recorded. The height measurement of the Z-interferometer will be greater than that of the reference substrate, because the processed substrate is thicker (i.e. has more layers) than the reference substrate. The height measurement of the level sensor will include an offset error which arises due to the height process dependency of the level sensor. This process dependent offset error is recorded.

Thus far, four measurements have been determined, the optimum vertical height for a reference substrate for both machines $M_A$, $M_B$, the optimum vertical height for machine $M_A$ for the processed substrate (e.g. via the FEM), and the process dependent offset error of the level sensor in machine $M_A$ for a processed substrate.

A processed substrate (i.e. a substrate which has undergone the same processing) is introduced into the second machine $M_B$, and the Z-interferometer is used to move the substrate to the optimum vertical height (i.e. applying the information for a processed substrate as determined using the first machine $M_A$). The level sensor height measurement which corresponds to this height is determined and recorded. The height measurement includes a process dependent offset error which may be different from the process dependent offset error of the level sensor of the first machine $M_A$. This process dependent offset error is recorded for the second machine $M_B$. The process dependent offset errors are different because the level sensor in each machine has a different process dependency. The process dependent offset errors of the machines $M_A$, $M_B$ are compared to provide a difference value. The difference value is recorded in a memory together with information regarding the particular process that was applied to the substrate.

According to an embodiment of the invention, the process dependent offset error of the level sensor of the second machine $M_B$ is determined for the processed substrate without having to repeat the measurement (e.g. FEM measurement) that was performed for the first machine $M_A$.

Although the above method has been described in terms of vertical height, it will be appreciated that an equivalent method may be performed to determine and correct tilt measurements.

It will be appreciated that the above method could be performed using a reference substrate that is a processed substrate instead of using a bare substrate. In the following equations, the term "unprocessed substrate" may be used to refer to the reference (e.g. Bane) substrate, however the equations below should be understood to include any other sort of reference substrate, as discussed above.

A given level sensor has a respective spot size that may be, in certain apparatus, variable. Because level sensor data is known in certain cases to vary with spot size, one embodiment of the present invention employs level sensors having substantially the same spot size in each lithographic apparatus to be characterized. In some instances, spot size will not have a large effect and each lithographic apparatus may have a different level sensor spot size.

The data collected according to the above described method can be expressed mathematically with the following Equations 1–3.

$$Z_{reference} - Z_{processed} = thickness_{processed} - thickness_{reference} + HPD_{process} + \varepsilon_{noise} + \varepsilon_{drift} \quad [\text{Eqn. 1}]$$

$$Rx_{reference} - Rx_{processed} = wedgeRx_{processed} - wedgeRx_{reference} + TPDRx_{processed} + \varepsilon_{noise} + \varepsilon_{drift} \quad [\text{Eqn. 2}]$$

$$Ry_{reference} - Ry_{processed} = wedgeRy_{processed} - wedgeRy_{reference} + TPDRy_{processed} + \varepsilon_{noise} + \varepsilon_{drift} \quad [\text{Eqn. 3}]$$

Equation 1 states that for a pair of substrates, one processed and one reference (e.g. unprocessed), the measured delta Z is equal to the thickness difference, plus the height process dependency of the level sensor measurement of the processed substrate, plus two error factors, one related to detector noise and the other due to drift. Equations 2 and 3 are similar and show that the measured change in rotation around an axis equals a wedge of the processed substrate minus wedge of the unprocessed substrate plus tilt process dependency and error factors for noise and drift.

Equations 4, 5, and 6 can then be used to relate the two machines for the measured process:

$$\Delta HPD_{M1-M2} = \quad [\text{Eqn. 4}]$$
$$(Z_{reference} - Z_{process})_{M1} - (Z_{reference} - Z_{process})_{M2} +$$
$$\varepsilon_{processed\_M1} - \varepsilon_{processed\_M2} + \varepsilon_{reference\_M2} -$$
$$\varepsilon_{reference\_M1} + \varepsilon_{noise\_M1} - \varepsilon_{noise\_M2} + \varepsilon_{drift\_M1} - \varepsilon_{drift\_M2}$$

In equation 4, $\epsilon_{processed}$ and $\epsilon_{reference}$ are overall errors in measured thickness and each has a value for each machine, M1, M2.

$$\Delta TPDRx_{M1-M2} = (Rx_{reference} - Rx_{process})_{M1} - \quad [\text{Eqn. 5}]$$
$$(Rx_{reference} - Rx_{process})_{M2} + \varepsilon_{Rxprocessed\_M1} -$$
$$\varepsilon_{Rxprocessed\_M2} + \varepsilon_{Rxreference\_M2} - \varepsilon_{Rxreference\_M1} +$$
$$\varepsilon_{Rxnoise\_M1} - \varepsilon_{Rxnoise\_M2} + \varepsilon_{Rxdrift\_M1} - \varepsilon_{Rxdrift\_M2}$$

$$\Delta TPDRy_{M1-M2} = (Ry_{reference} - Ry_{process})_{M1} - \quad [\text{Eqn. 6}]$$
$$(Ry_{reference} - Ry_{process})_{M2} + \varepsilon_{Ryprocessed\_M1} -$$
$$\varepsilon_{Ryprocessed\_M2} + \varepsilon_{Ryreference\_M2} - \varepsilon_{Ryreference\_M1} +$$
$$\varepsilon_{Rynoise\_M1} - \varepsilon_{Rynoise\_M2} + \varepsilon_{Rydrift\_M1} - \varepsilon_{Rydrift\_M2}$$

Likewise, after making the two sets of measurements for each of a group of machines, any two machines can be compared using equations 4, 5 and 6. Once the sets of data are collected and the equations evaluated, the results may be used to adjust a focal plane of the apparatus so that each exposure is in or near a best focus plane. Additional sets of data for each of the reference and processed substrates may be measured for additional apparatus so that more than two apparatus may be characterized in a similar fashion. In characterizing multiple apparatus, for example, a third apparatus may be compared to either one of a first and a second apparatus or a combination of the two.

In certain circumstances, height process dependency accounts for a larger problem than does either of the two tilt process dependencies. In such a case, a method in accordance with an embodiment of the present invention may be employed measuring only the height measurements for each point measured. The inventors have determined that by using light having a wavelength less than about 950 nm, level sensor process dependency may be further reduced.

Drift calibrations can be made in order to correct for machine drift. Likewise, noise error may be reduced by averaging a series of measurements. By employing both techniques, the error ($\epsilon$) portions of each equation can be reduced to a very low level leaving a measurement that essentially captures the process dependencies. In practice, these corrections can provide measurements that have a higher degree of accuracy than FEMs while greatly reducing the total time necessary to make the measurements. In one example of a drift correcting method, multiple measurements are made on each apparatus for each substrate and the two substrates are alternated between measurements. The resulting data points may be plotted to show a drift curve. The empirically determined curve may be used to extrapolate drift data, or, in some cases, a function may be fit to the curve and used to calculate expected drift.

It is further contemplated that multiple reference substrates may be employed in order to provide reduced error. Likewise, it is contemplated that substrates to be measured could be aligned at a plurality of different angles prior to leveling.

In the above embodiments of the invention, the methods have been described in relation to FEM measurements which determine the best focus via exposure of images. Typically, such FEM measurements are performed such that they give a single height (or tilt) for a given exposure field (or target area). In an embodiment of the invention, however, the FEM may be performed using images which are significantly smaller than a conventional exposure field, allowing more than one image (e.g. several or even many) to be exposed per conventional exposure field. This technique may be used to allow the process dependent offset error of the level sensor to be determined at a plurality of points within a conventional exposure field. The method described above can therefore be used for measurements within the conventional exposure field, i.e. intrafield measurements.

In an embodiment of the invention, the intrafield measurements may, as an alternative to using exposure of images, be determined using a process independent sensor, for example an air gauge sensor. A suitable air gauge sensor is described in U.S. Pat. Nos. 4,953,388 and 4,550,592.

One potential advantage of such a method is that if desired, the process independent (e.g. air gauge) sensor may be used for only the first machine $M_A$, rather than for each of the machines $M_A$, $M_B$. Therefore, even if an air gauge sensor has been fitted to only one machine of a multiplicity of machines located in a fabrication facility, the method can be used to determine the intrafield process dependent height (or tilt) offset error of level sensors in each of the machines in the fabrication facility.

Although embodiments of the invention have been described in terms of lithographic apparatus in which the level sensor and the projection system are in the same location (a so called single-stage system), it will be appreciated that applications of the invention on include use with lithographic apparatus in which the level sensor and the projection system are in different locations (a so called dual-stage system).

Although the vertical height measurement has been described as being determined using a Z-interferometer, it will be appreciated that any other suitable measurement device may be used.

Embodiments of the invention may be used for two lithographic apparatus of the same design. Alternatively, embodiments of the invention may be used for two lithographic apparatus of different designs. When this is done, it may be desirable to include some adaptation, for example to match the level sensor spot size and location of the first lithographic apparatus to the level sensor spot size and location of the second lithographic apparatus.

While specific embodiments of the invention have been described above, it will be appreciated that the invention may be practiced otherwise than as described. Embodiments of the invention also include computer programs (e.g. one or more sets or sequences of instructions) to control a lithographic apparatus to perform a method as described herein, and storage media (e.g. disks, semiconductor memory) storing one or more such programs in machine-readable form. The description is not intended to limit the invention.

What is claimed is:

1. A method of calibrating level sensors of at least two lithographic projection apparatus to correct machine to machine level sensor process dependency, said method comprising:
    using a first lithographic apparatus, measuring a first set of leveling data for a reference substrate,
    using the first lithographic apparatus, measuring a second set of leveling data for a substrate processed according to a first process;
    using a second lithographic apparatus, measuring a third set of leveling data for a reference substrate;
    using the second lithographic apparatus, measuring a fourth set of leveling data for a substrate processed according to the first process; and
    based on the first, second, third and fourth sets of leveling data, calculating a set of level sensor parameters corresponding to machine to machine level sensor differences for the first process,
    wherein the machine to machine level sensor differences are measured and stored as intrafield values.

2. The method according to claim 1, wherein said measuring a second set of leveling data is performed using an air gauge sensor.

3. The method according to claim 1, wherein said measuring a second set of leveling data is performed using an off-line measurement tool in addition to the first lithographic apparatus.

4. The method according to claim 1, wherein said measuring a first set of leveling data for a reference substrate includes measuring a first set of leveling data for a bare substrate.

5. The method according to claim 1, wherein said measuring a first set of leveling data for a reference substrate includes measuring a first set of leveling data for a substrate having a calibration resist thereon.

6. The method according to claim 1 wherein said measuring a first set of leveling data for a reference substrate includes measuring a first set of leveling data for a substrate that has been processed according to a second process, and wherein said method comprises characterizing a machine to machine process dependency of the second process.

7. The method according to claim 1 further comprising:
    using a third apparatus, measuring a fifth set of leveling data for a reference substrate;
    using the third apparatus, measuring a sixth set of leveling data for a substrate processed according to the first process performing additional measurements; and
    based on the fifth and sixth sets of leveling data, and based on the first and second sets of leveling data and/or the third and fourth sets of leveling data, calculating a set of level sensor parameters corresponding to machine to machine level sensor differences for the first process.

8. The method according to claim 1, wherein said measuring comprises taking a plurality of intrafield measurements at each of a plurality of locations on the corresponding substrate.

9. The method according to claim 1, wherein said measuring comprises taking a plurality of measurements at each measured point on the measured substrates, and
    wherein the substrates are alternated between measurements.

10. The method according to claim 1, wherein said measuring comprises maintaining the substrate on a chuck during measurements and reloading the substrate onto the chuck between measurements.

11. The method according to claim 1, wherein said measuring comprises using a level sensor of the corresponding lithographic apparatus, each of said level sensors having a respective spot size and each of said respective spot sizes being substantially the same size.

12. A device manufacturing method using a lithographic apparatus, said method comprising:
    imaging a patterned beam of radiation onto a target area of a substrate having a layer of radiation sensitive material; and
    prior to said imaging, determining and providing a set of process dependent parameters for adjusting the imaging, said determining including:
        using a first lithographic apparatus, measuring a first set of leveling data for a reference substrate,
        using the first lithographic apparatus, measuring a second set of leveling data for a substrate processed according to a first process;
        using a second lithographic apparatus, measuring a third set of leveling data for the reference substrate;
        using the second lithographic apparatus, measuring a fourth set of leveling data for a substrate processed according to the first process; and
        based on the first, second, third and fourth sets of leveling data, calculating a set of level sensor parameters corresponding to machine to machine level sensor differences for the first process, wherein the machine to machine level sensor differences are measured and stored as intrafield values.

13. A device manufactured according to the method of claim 12.

14. A lithographic system comprising:
    a radiation system configured to provide a beam of radiation;
    a support structure configured to support a patterning structure, the patterning structure being configured to pattern the beam according to a desired pattern;
    a substrate table configured to hold a substrate;
    a projection system configured to project the patterned beam onto a target portion of the substrate;
    in a first lithographic apparatus, means for measuring a first set of leveling data for a reference substrate;

in the first lithographic apparatus, means for measuring a second set of leveling data for a substrate processed according to a first process;

in a second lithographic projection apparatus, means for measuring a third set of leveling data for a reference substrate;

in the second lithographic projection apparatus, means for measuring a fourth set of leveling data for a substrate processed according to the first process; and a processor configured to calculate, based on the first, second, third and fourth sets of leveling data, a set of level sensor parameters corresponding to machine to machine level sensor differences for the first process, wherein the machine to machine level sensor differences are measured and stored as intrafield values.

15. The lithographic system according to claim 14, wherein the first lithographic apparatus comprises an air gauge sensor.

16. The lithographic system according to claim 14, wherein at least one of said means for measuring includes a level sensor using radiation having a wavelength less than about nine hundred fifty (950) nanometers.

17. A method of calibration, said method comprising:
using a first sensor of a first lithographic apparatus, measuring a first set of surface position data for a reference substrate,
using the first sensor, measuring a second set of surface position data for a substrate processed according to a first process;
using a second sensor of a second lithographic apparatus, measuring a third set of surface position data for a reference substrate;
using the second sensor, measuring a fourth set of surface position data for a substrate processed according to the first process; and
based on the first, second, third and fourth sets of surface position data, calculating a plurality of distances between a measurement error of the first sensor corresponding to the first process and a measurement error of the second sensor corresponding to the first process, wherein each of said plurality of distances is associated with a corresponding location, all of the corresponding locations being within the same exposure field of the second lithographic apparatus.

18. The method of calibration according to claim 17, wherein said measuring a first set of surface position data and said measuring a third set of surface position data are performed for the same reference substrate.

19. The method of calibration according to claim 17, wherein said measuring a third set of surface position data and said measuring a fourth set of surface position data are performed for the same processed substrate.

20. The method of calibration according to claim 17, wherein said measuring a second set of surface position data is performed using an air gauge sensor.

21. The method of calibration according to claim 17, wherein said measuring a first set of surface position data for a reference substrate includes measuring a first set of surface position data for a bare substrate.

22. The method of calibration according to claim 17, wherein said measuring a first set of surface position data for a reference substrate includes measuring a first set of surface position data for a substrate having a calibration resist thereon.

23. The method of calibration according to claim 17, wherein said first sensor comprises a first level sensor having a first spot size, and
wherein said second sensor comprises a second level sensor having a second spot size substantially the same as the first spot size.

24. The method of calibration according to claim 17, wherein measuring at least one of said sets of surface position data includes using radiation having a wavelength less than about nine hundred fifty (950) nanometers.

25. The method of calibration according to claim 17, wherein said measuring a first set of surface position data comprises:
using a projection system to image a pattern onto the reference substrate at each of a plurality of different target locations, a distance between a surface of the substrate at the target location and a final optical surface of the projection system during the imaging being different for each of the plurality of target locations; and
selecting a target location, from among the plurality of target locations, based on a quality of the corresponding image.

26. The method of calibration according to claim 17, wherein said measuring a second set of surface position data comprises:
imaging a pattern onto the substrate at each of a plurality of different target locations, a displacement of a surface of the substrate during the imaging being different for each of the plurality of target locations, and
for each of the plurality of target locations, evaluating a quality of the corresponding image.

27. The method of calibration according to claim 17, wherein said first set of surface position data includes information characterizing a relative displacement along an axis perpendicular to a surface of the substrate and information characterizing a relative rotation about an axis parallel to the surface of the substrate.

28. The method of calibration according to claim 17, wherein said calculating comprises, based on the first and second sets of surface position data, determining a process dependent error of the first sensor at each of a plurality of locations within an exposure field of the first lithographic apparatus.

29. The method of calibration according to claim 28, said method comprising, based on the process dependent error of the first sensor, determining a process dependent error of the second sensor at each of the plurality of locations.

* * * * *

UNITED STATES PATENT AND TRADEMARK OFFICE
CERTIFICATE OF CORRECTION

| | | |
|---|---|---|
| PATENT NO. | : 6,987,555 B2 | Page 1 of 1 |
| APPLICATION NO. | : 10/892395 | |
| DATED | : January 17, 2006 | |
| INVENTOR(S) | : Teunissen et al. | |

It is certified that error appears in the above-identified patent and that said Letters Patent is hereby corrected as shown below:

On the cover page, item (63), Related U.S. Application Data, change "April 18, 2004" to -- April 18, 2003--;
in column 1, line 8, change "April 18, 2004" to -- April 18, 2003--;
in column 1, line 66, change "adressable" to -addressable--; and
in column 12, line 67, change "on" to --can--.

Signed and Sealed this

First Day of August, 2006

JON W. DUDAS
*Director of the United States Patent and Trademark Office*